United States Patent
Kuo et al.

(10) Patent No.: US 7,125,795 B2
(45) Date of Patent: Oct. 24, 2006

(54) FABRICATION METHOD FOR MICROSTRUCTURES WITH HIGH ASPECT RATIOS

(75) Inventors: Nai-Hao Kuo, Hsinchu (TW); Kai-Hsiang Yen, Hsinchu (TW); Jing-Hung Chiou, Hsinchu (TW); Po-Hao Tsai, Hsinchu (TW); Yuh-Wen Lee, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 186 days.

(21) Appl. No.: 10/992,709

(22) Filed: Nov. 22, 2004

(65) Prior Publication Data

US 2005/0064650 A1   Mar. 24, 2005

Related U.S. Application Data

(63) Continuation-in-part of application No. 10/424,789, filed on Apr. 29, 2003, now abandoned.

(51) Int. Cl.
*H01L 21/4763* (2006.01)

(52) U.S. Cl. .................... 438/637; 438/672

(58) Field of Classification Search ............... 438/637, 438/619, 622, 672, 675, 48, 52–53
See application file for complete search history.

(56) References Cited

U.S. PATENT DOCUMENTS

| | | | |
|---|---|---|---|
| 5,393,375 A | 2/1995 | MacDonald et al. | |
| 5,719,073 A | 2/1998 | Shaw et al. | |
| 5,846,849 A | 12/1998 | Shaw et al. | |
| 6,051,866 A | 4/2000 | Shaw et al. | |
| 6,537,849 B1 * | 3/2003 | Tsai et al. | 438/106 |
| 6,756,673 B1 * | 6/2004 | Ahn et al. | 257/751 |

* cited by examiner

*Primary Examiner*—Theresa T. Doan
(74) *Attorney, Agent, or Firm*—Birch, Stewart, Kolasch & Birch, LLP

(57) ABSTRACT

A fabrication method for microstructures with high aspect ratios uses a CMOS process to form a desired microstructure on a silicon substrate. The steps of forming a contact plug and a via plug of the process are used to form etching channels in insulation layers, polysilicon layers and metal layers, penetrating to the silicon substrate. An etching process is then performed through the etching channel to form the desired microstructure with high aspect ratio.

9 Claims, 6 Drawing Sheets

FABRICATION METHOD FOR MICROSTRUCTURES WITH HIGH ASPECT RATIOS

CROSS-REFERENCE TO RELATED APPLICATIONS

This application is a continuation in part of U.S. Ser. No. 10/424,789 filed Apr. 29, 2003, now abandoned.

BACKGROUND OF THE INVENTION

1. Field of Invention

The invention relates to a fabrication method for microstructures, and in particular to a fabrication method for making microstructures with high aspect ratio using complementary metal-oxide semiconductor (CMOS) processes.

2. Related Art

Currently, there are many techniques that integrate microelectromechanical elements and integrated circuits (IC) on a single chip. One of them is the suspending micro-electromechanical element in which a micro suspending structure is formed by etching the bottom silicon substrate of the micro-electromechanical element when the IC layout is completed.

A suspending microstructure, such as comb actuator, uses electrostatic forces to displace the suspending structure, producing the power for other micromechanical structures. Another example is the accelerometer. The external force displaces the suspending mass block and changes the charge between electrode gate plates, thereby measuring the acceleration of the object. One feature of these devices is that they are micro-electromechanical devices with high aspect ratio.

The microstructure with high aspect ratio is usually used in mechanical devices that have a large spring constant K. This is because the mechanical devices with a large spring constant K need to use the microstructures with high aspect ratio to obtain a shorter response time.

There are many methods proposed to make microstructures with high aspect ratio. For example, U.S. Pat. Nos. 5,393,375, 5,719,073, 5,846,849 and 6,051,866 disclose microstructures with high aspect ratios and manufacturing methods of the same. The main technical feature is to use thin-film deposition processes, photolithography processes, and dry etching processes to form the microstructures. The main steps are as follows. First, one or more dielectric layers are deposited as a mask layer. The photolithography process is then used to define the mask shape. Afterwards, use drying etching to form the high aspect ratio structure. Another oxide thin film is then deposited thereon. The thin film at the bottom of the grooves is removed by etching. Continuously etch the silicon substrate by dry etching and isotropic dry etching to remove the bottom of the structure so that the structure is suspended. Finally, a metal is deposited as an electrode.

In the manufacturing steps disclosed above, the stacking of different materials of thin films and further corresponding etching are only for forming a microstructure with high aspect ratio. Additional steps are needed for forming an IC layout to drive the microstructure or other circuits to connect the microstructures. Current packaging techniques are able to electrically connect the microstructure to other circuits for enabling the microstructure or measuring the desired signal. However, the integration of microstructures and other circuits has become more complicated, thus increasing cost.

On the other hand, the manufacturing methods of high aspect ratio structures described above cannot apply the processes used in semiconductor manufacturing; therefore mass production is not available. This makes product manufacturing a big problem.

SUMMARY OF THE INVENTION

In view of the forgoing, an objective of the invention is to provide a fabrication method for microstructures with high aspect ratios, using well developed CMOS layout techniques and subsequent etching processes to simultaneously form suspending microstructures with a high aspect ratio and the circuits needed, so that the complication of the packaging process of the microstructure is reduced and the integration effectiveness of microstructures and circuits is improved. Further, the microstructure with high aspect ratio uses well-developed equipment of CMOS processes in factories; therefore there is no need to purchase new equipment, which reduces cost.

The disclosed technology uses CMOS processes to deposit an insulation layer, a polysilicon layer and a metal layer and uses photolithography and etching processes to form the microstructure and the circuits' layout simultaneously. The amount of polysilicon layers and metal layers depend on the user's needs. The features of the invention are as follows. While contact plugs connecting the silicon substrate and the first metal layer and via plugs connecting different metal layers are formed, photolithography and etching processes are also used to form etching channels penetrating through the insulation layer, the polysilicon layer and the metal layer. The etching channel exposes the surface of the silicon substrate. Dry etching or wet etching is used to etch the silicon substrate to suspend the microstructure.

In order to achieve the above objective, the disclosed fabrication method of suspending microstructures with high aspect ratio includes the following steps. First, a substrate is provided. The silicon substrate surface is deposited with at least one insulation layer, at least one polysilicon layer and at least one metal layer. The amounts and the stacking order of the insulation layers, polysilicon layers and metal layers depend on the process. For example, the user can choose a process of one poly silicon layer and four metal layers (1P4M), two polysilicon layers and three metal layers (2P3M), and so on, as provided in present semiconductor factories. The photolithography and etching processes are used to form the layers and the circuit layout needed. For example, while contact plugs connecting the silicon substrate and first metal layer and via plugs connecting different metal layers are formed, the photolithography and etching processes are also used to form etching channels penetrating through the insulation layer, the polysilicon layer and the metal layer. The etching channel exposes the surface of the silicon substrate. Dry etching or wet etching is used to etch the silicon substrate until the microstructure is suspended. According to the above process, the fabrication process of the microstructure with high aspect ratio (the height of the microstructure depends on the thickness of stacked insulation layers, polysilicon layers and metal layers) and the related circuit layers are completed simultaneously.

It is to be understood that both the foregoing general description and the following detailed description are exemplary and explanatory and are intended to provide further explanation of the invention as claimed.

DETAILED DESCRIPTION OF THE INVENTION

Figure 1:
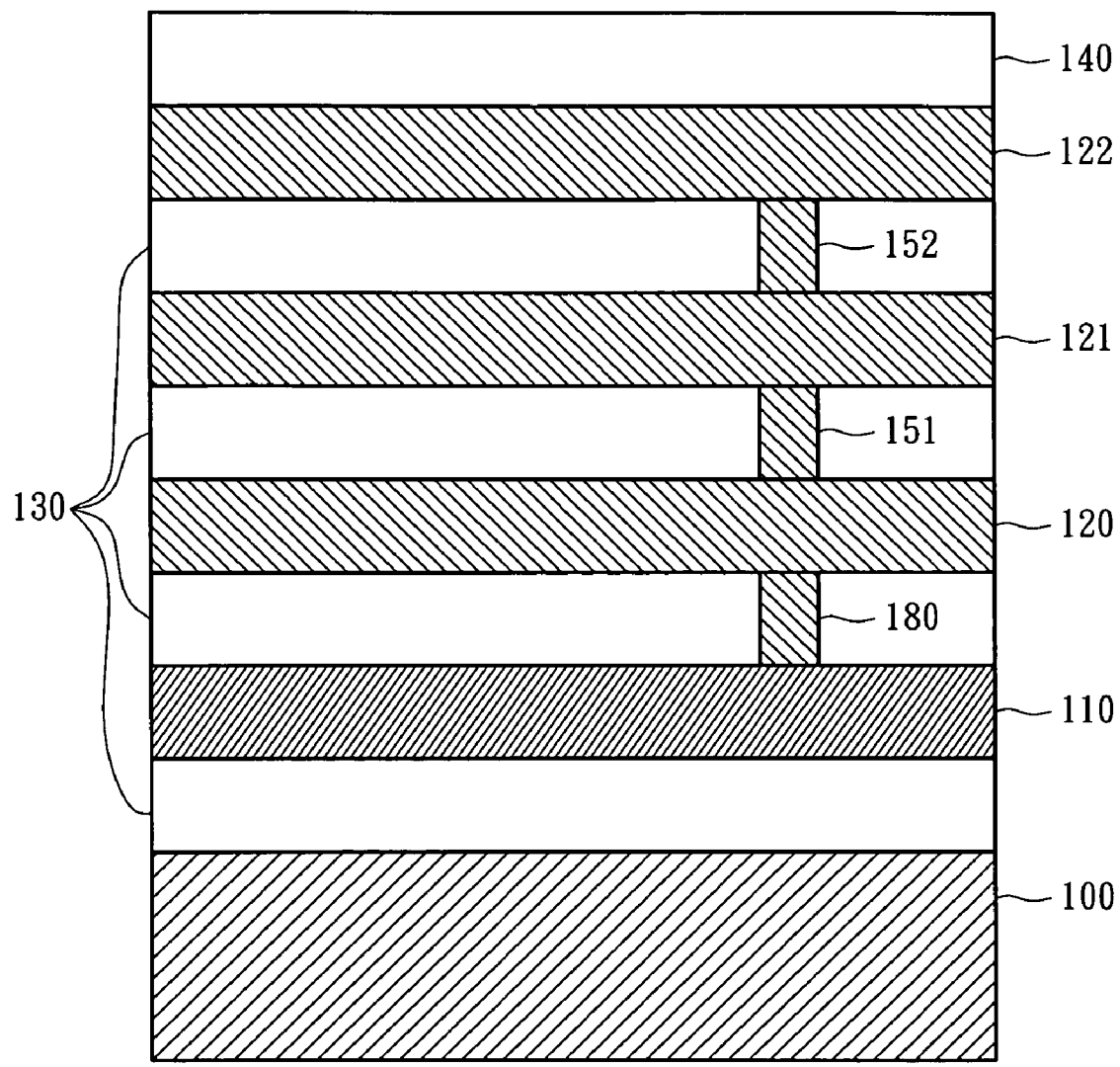
FIG. 1 is a schematic view of a conventional 1P3M CMOS stacked structure.

Please refer to FIG. 1, which shows a conventional stacked structure using a single poly three metal (1P3M) complementary metal-oxide semiconductor (CMOS) process. The stacked structure is formed by forming on the surface of the silicon substrate 100 a desired multilayer circuit structure, including a polysilicon layer 110, a first metal layer 120, a second metal layer 121, a third metal layer 122 and a dielectric layer 130 in between.

A contact plug is formed between the first metal layer 120 and polysilicon layer 110. A first via plug 151 is formed between the first metal layer 120 and the second metal layer 121. A second via plug 152 is formed between the second metal layer 121 and the third metal layer 122. Finally, the third metal layer 122 is covered with a passivastion layer 140 to prevent the IC from external impurities and mechanical damage.

The Contact plugs and via plugs are techniques used in multi metallization processes. The contact plug refers to the embedding connecting the electrodes of an MOS transistor to the metal layer. The via plug is used to communicate upper metal layers and lower metal layers. To avoid short circuits, a dielectric layer for insulating is inserted between two metal layers. The material of the dielectric layer includes silicon dioxide ($SiO_2$).

The microstructure related circuit layouts can be defined as the polysilicon layer, the metal layer, the contact plug, and the via plug form.

Figure 2:
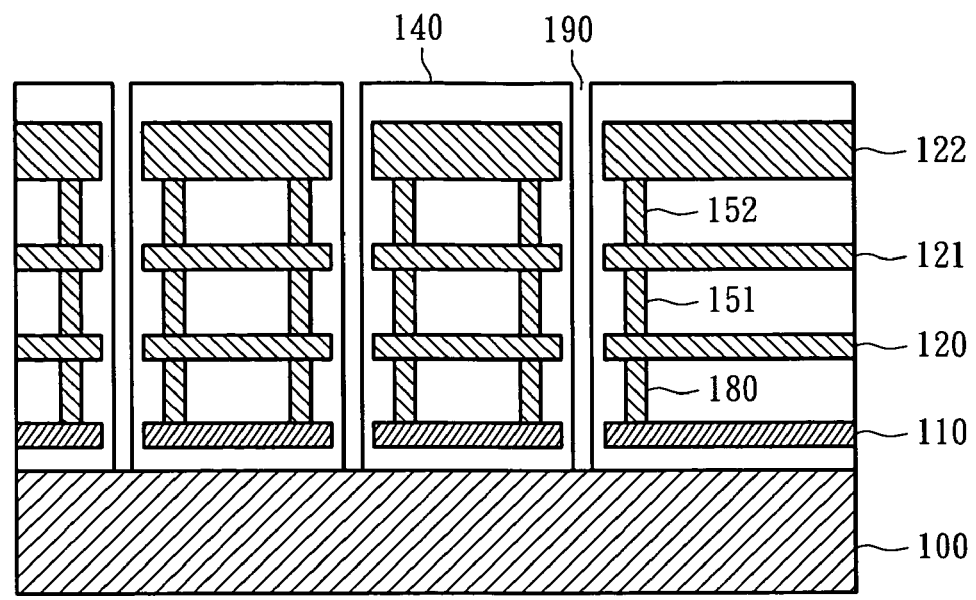
FIG. 2 is a schematic view of the microstructure of the invention.

From FIG. 1 one can see that a continuous etching channel 190 can be formed with the stacking process of each layer of the microstructure if a part of the etching channel is designed and formed using the same photolithography process at the time of designing and forming the first via plug 151, the second via plug 152 or the contact plug 180, and the deposited metal or polysilicon materials in the etching channel 190 are all removed by etching. After the microstructure process is done, as shown in FIG. 2, one can use the etching channel 190 to etch the silicon substrate 100.

Figure 3:
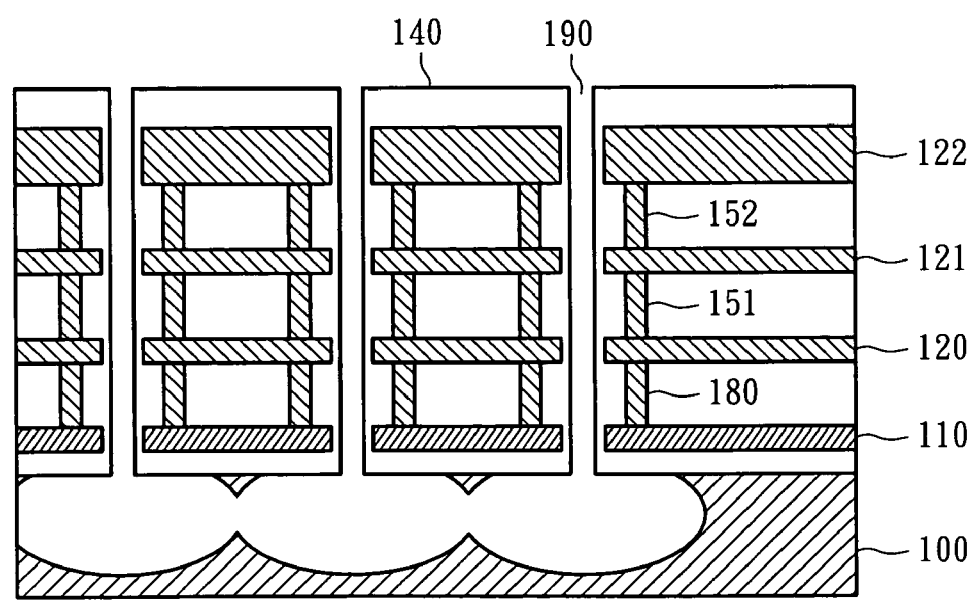
FIG. 3 is a schematic view of a suspending microstructure with a high aspect ratio of the invention.

Finally, referring to FIG. 3, use the formed etching channel to perform anisotropic etching, such as dry etching or wet etching to the silicon substrate 100, so that a microstructure with high aspect ratio is produced.

The 1P3M structure is used as an embodiment to explain the above concept. Please refer to FIGS. 4A through 4L, which are schematic views of steps in the fabrication process of making the disclosed suspending microstructure with a high aspect ratio.

Figure 4A:
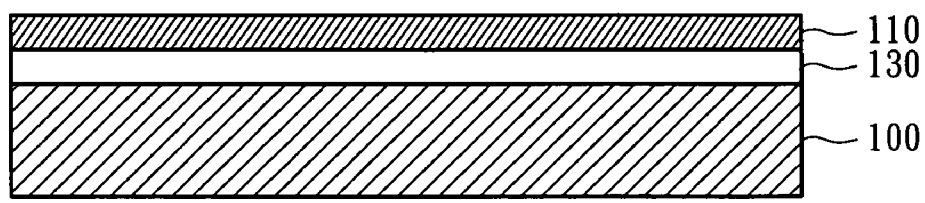
FIGS. 4A through 4M are schematic views of steps in the fabrication process of making the disclosed suspending microstructure with a high aspect ratio of the invention.

First, as shown in FIG. 4A, successively deposit an insulation layer 130 and a polysilicon layer 110 on a silicon substrate 100. Deposition techniques such as physical vapor deposition (PVD) and chemical vapor deposition (CVD) can be used to form the insulation layer 130 and the polysilicon layer 110.

Figure 4B:
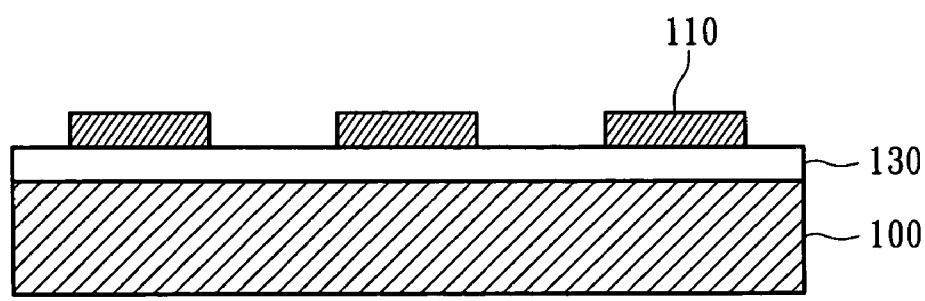
Figure 4C:
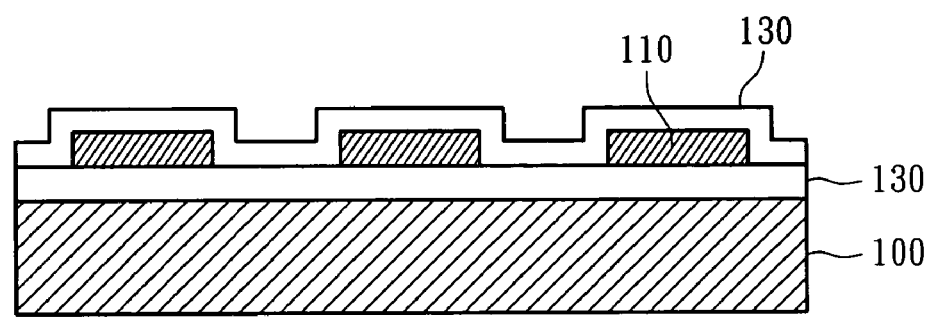
Figure 4D:
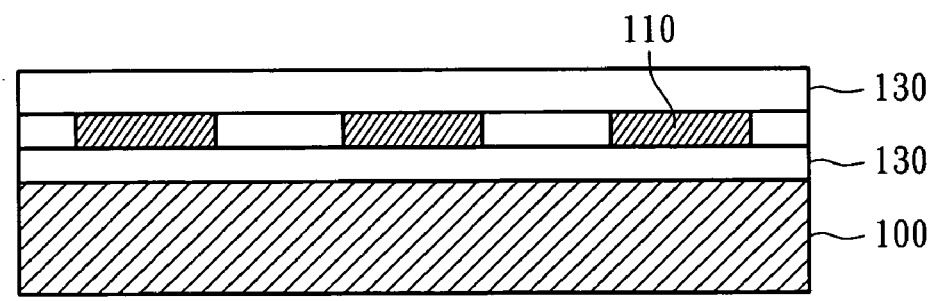

As shown in FIG. 4B, a photolithography process and an etching process are used to define the geometric size of the polysilicon layer 110. After that, as shown in FIG. 4C, an insulation layer 130 is deposited. As shown in FIG. 4D, another insulation layer is then deposited on the insulation layer 130. Next, annealing or other appropriate methods are used to planarize the insulation 130.

Figure 4E:
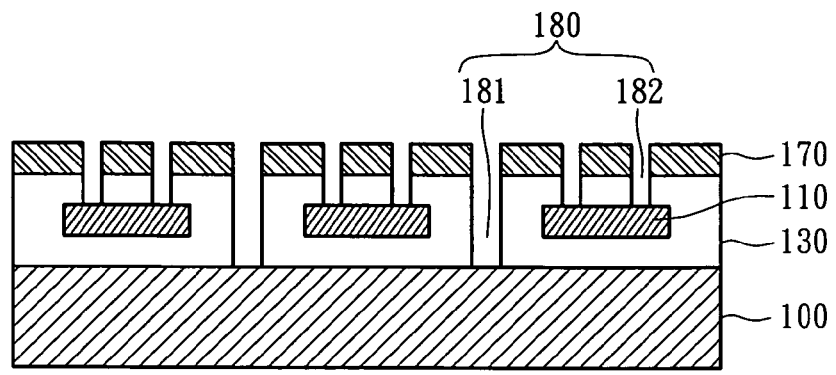

Afterwards, as shown in FIG. 4E, a photoresist layer is coated on the insulation 130, and photolithography and etching processes are performed to define shapes and positions of the contact plug in the insulation layer 130. There are two kinds of contact plugs. One is the first contact plug 181 penetrating to the silicon substrate 100. The other is the second contact plug 182 penetrating to the polysilicon layer 110. The first contact plug 181 and the second contact plug 182 are formed at the same time with the same photolithography and etching processes.

Figure 4F:
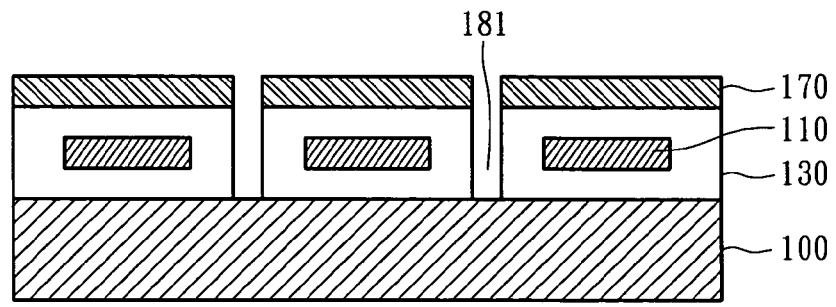

The first contact plug 181 is an etching channel used for subsequently etching the silicon substrate 100. Whether or not to form the second contact plug 182 is determined by the design of the circuit layout. As shown in FIG. 4F, if the polysiliicon layer 110 and the metal layer thereon do not need to be penetrated, the second contact plug 182 is no longer needed. However the first contact plug 181 is always needed as an etching channel.

Figure 4G:
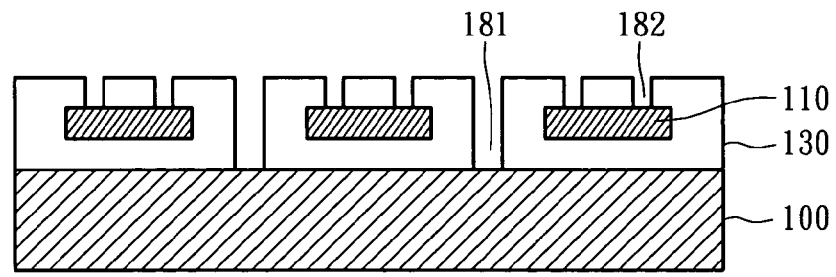
Figure 4H:
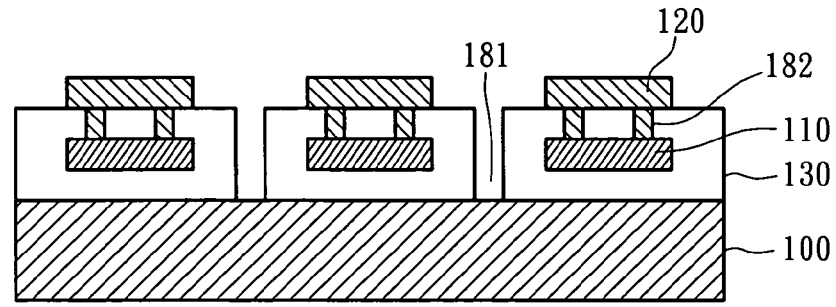

Moreover, as shown in FIG. 4G, the photoresist layer 170 of the structure (shown in FIG. 4E) is removed. Afterwards, as shown in FIG. 4H, a chemical vapor deposition (CVD) or a physical vapor deposition (PVD) technique is used to deposit a first metal layer 120 on the insulation layer 130 and the polysilicon layer 110, and define the geometric size of the first metal layer 120. The material of the metal layer can be selected from Al, Cu and AlCu alloy.

Figure 4I:
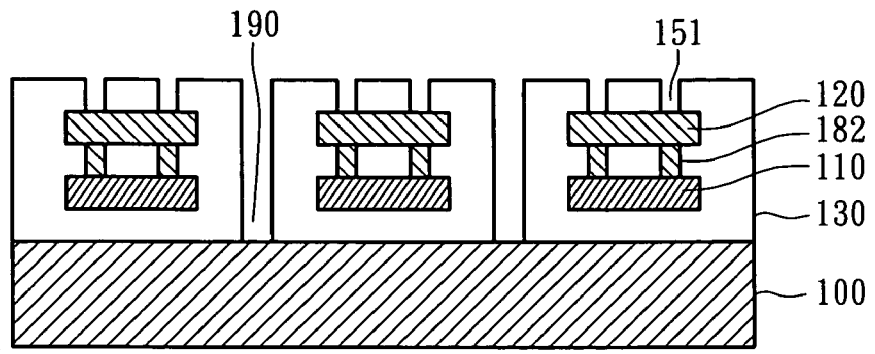
Figure 4J:
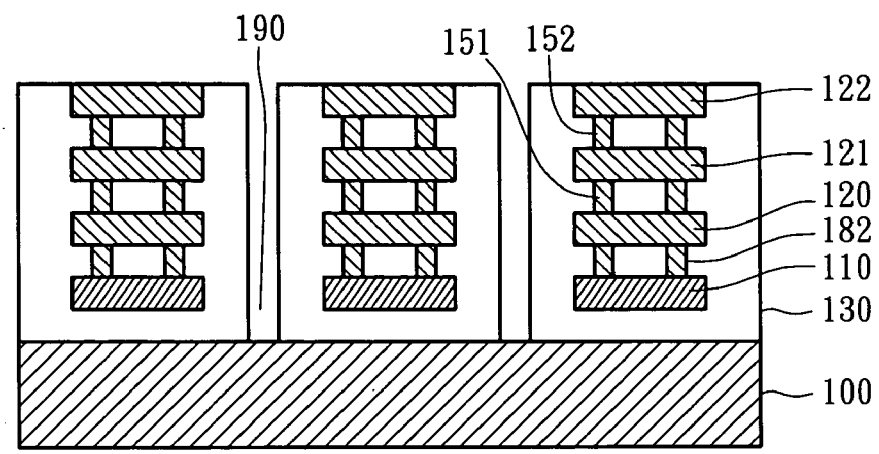

As shown in FIG. 4I, deposit upon the first metal layer 120 an insulation layer 130 and define a first via plug 151 in the insulation layer 130. Use photolithography and etching processes to remove the unnecessary metal layer and the insulation layer. After removing the deposited metals and insulation materials in the first contact plug 181, an etching channel is formed.

By repeating the steps of the thin film process, photolithography process and etching process to successively form the first metal layer 120, second metal layer 121, third metal layer 122, insulation layer 130, first via plug 151 and second via plug 152 that penetrate through different metal layers, the microstructure (shown in FIG. 4J) is formed. The etching channel is also formed while using the photolithography and etching processes to form the first via plug 151, the second via plug 152 and the first contact plug 181. Therefore, the related circuit layout is formed as the microstructure is completed.

However, during the process of making the second contact plug 182, first via plug 151 and second via plug 152, the metal, insulation materials or other materials accumulated in the first contact plug 181 must be completely removed to expose the silicon substrate 100. Therefore the first contact plug 181 can be an etching channel for etching the silicon substrate 100.

Figure 4K:
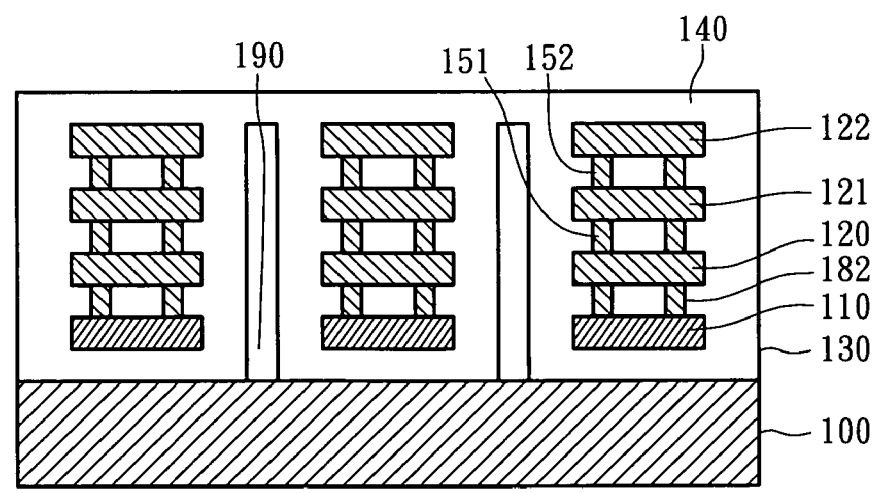

Afterwards, please refer to FIG. 4K, a passivation layer 140 is deposited on the third metal layer 122, completing the manufacturing of the microstructure and the circuits.

Figure 4L:
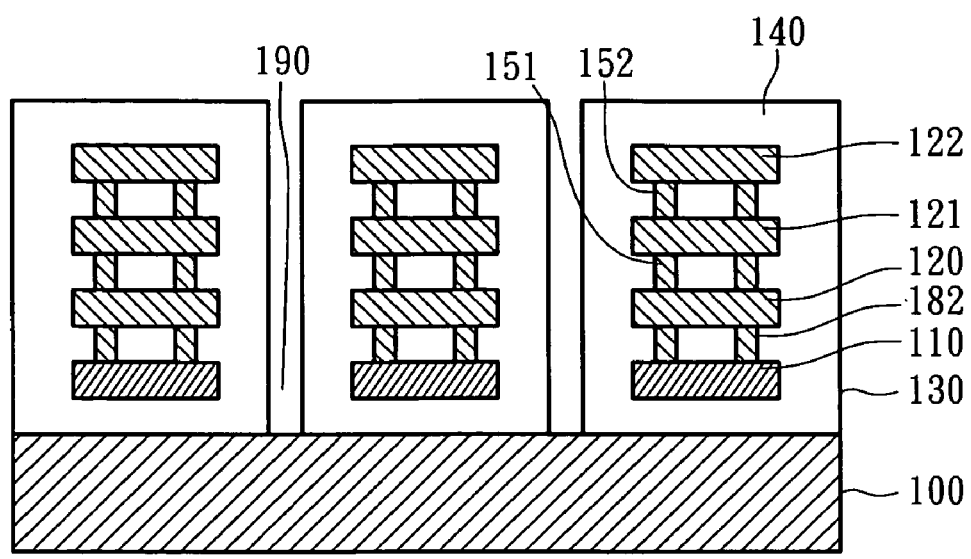

Once the manufacturing of the microstructure is completed, as shown in FIG. 4L, the passivation layer 140 above the etching channel 190 is etched using an etching process to form a complete etching channel. From the drawing, it is observed that the metal on the sidewall structure is covered by the insulation layer. Therefore, no metal contact occurs among the structures so no short circuit can occur. The material of the passivation layer includes silicon nitride.

Figure 4M:
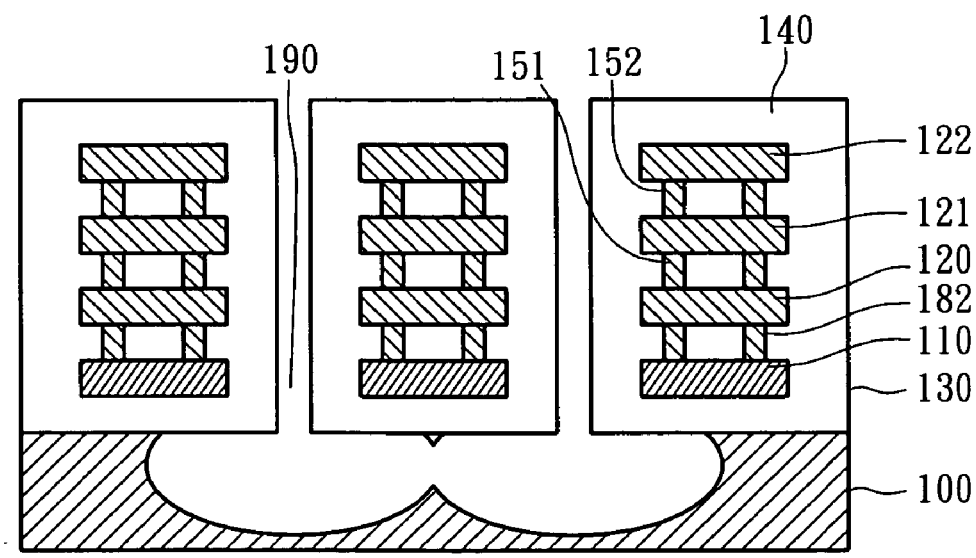

Finally, as shown in FIG. 4M, an isotropic etching process such as isotropic dry etching or isotropic wet etching is performed to etch the exposed silicon substrate 100 until it is suspended so a microstructure with high aspect ratio is formed.

The invention is not limited in using the 1P3M process described above. For example a 1P4M process or a 2P4M process, which are provided in semiconductor manufacturing factories, can also be used to form the desired microstructure and related circuits.

It will be apparent to those skilled in the art that various modifications and variations can be made in the fabricating method of the invention without departing from the spirit or scope of the invention. Thus, it is intended that the invention covers the modifications and variations of the invention provided that they come within the scope of the appended claims and their equivalents.

What is claimed is:

1. A fabrication method for microstructures with a high aspect ratio, the method comprising the steps of:
    (a) providing a silicon substrate;
    (b) depositing a first insulation layer on a surface of the silicon substrate, and forming a first polysilicon layer with predetermined pattern on the first insulation layer;
    (c) depositing a second insulation layer on a surface of the first polysilicon layer, and planarizing the second insulation layer;
    (d) selectively etching the second insulation layer in a first predetermined pattern on the first polysilicon layer to form a contact plug that penetrates to the first polysilicon layer, and simultaneously etching the second insulation layer in a predetermined pattern on the first insulation layer to form a etching channel that penetrates to the silicon substrate;
    (e) depositing a first metal layer on the second insulation layer;
    (f) defining the geometry size of the first metal layer, and removing the first metal layer that corresponds the etching channel by etching;
    (g) depositing a passivation layer on the first metal layer to form a microstructure and a circuit layout; and
    (h) etching the silicon substrate through the etching channel to suspend the microstructure, forming a microstructure with high aspect ratio.

2. The fabrication method of claim 1, wherein the method uses a CMOS process.

3. The fabrication method of claim 1, further includes a step of forming a second polysilicon layer with a predetermined pattern on the second insulation layer and repeating performing the step (c) and the step (d) after the step (d).

4. The fabrication method of claim 1, further includes the following steps after the step (f):
    depositing a third insulation layer on the first metal layer; and
    selectively etching the third insulation layer in a predetermined pattern on the first metal layer to form a contact plug that penetrates to the first metal layer, and simultaneously etching the third insulation layer in a predetermined pattern on the second insulation layer to form the etching channel that penetrates to the silicon substrate.

5. The fabrication method of claim 1, wherein the first insulation layer and the second insulation layer are formed form silicon dioxide.

6. The fabrication method of claim 1, wherein the first metal layer is selected from a group consisted of aluminum, copper and their alloys.

7. The fabrication method of claim 1, wherein the passivation layer is formed from silicon nitride.

8. The fabrication method of claim 1, wherein the (h) step uses dry etching to etch the silicon substrate.

9. The fabrication method of claim 1, wherein the (h) step uses wet etching to etch the silicon substrate.

* * * * *